United States Patent

[11] 3,602,982

[72] Inventor Else Kooi
Emmasingel, Eindhoven, Netherlands

[21] Appl. No. 721,953
[22] Filed Apr. 17, 1968
[45] Patented Sept. 7, 1971
[73] Assignee U.S., Philips, Corporation
New York, N.Y.
[32] Priority May 13, 1967
[33] Netherlands
[31] 6706735

[54] METHOD OF MANUFACTURING A SEMICONDUCTOR DEVICE AND DEVICE MANUFACTURED BY SAID METHOD
9 Claims, 16 Drawing Figs.

[52] U.S. Cl. .......... 29/577, 148/175, 317/235, 29/578
[51] Int. Cl. .......... B01j 17/00, H01l 1/16
[50] Field of Search .......... 29/578, 577, 577 IC, 576 IW, 175; 317/235; 148/187, 188

[56] References Cited
UNITED STATES PATENTS

| | | | |
|---|---|---|---|
| 3,158,788 | 11/1964 | Last | 317/101 |
| 3,290,753 | 12/1966 | Chang | 29/577 |
| 3,387,358 | 6/1968 | Heiman | 29/578 X |
| 3,442,011 | 5/1969 | Strieter | 29/578 |
| 3,150,299 | 9/1964 | Noyce | 317/235 |
| 3,377,513 | 5/1966 | Ashby et al. | 317/101 |
| 3,477,886 | 11/1969 | Ehlenberger | 148/187 |

*Primary Examiner*—John F. Campbell
*Assistant Examiner*—W. Tupman
*Attorney*—Frank R. Trifari

ABSTRACT: A method for making an integrated circuit with circuit elements dielectrically isolated is described. The method involves growing an epitaxial layer on a substrate, masking where desired the epitaxial layer surface against oxidation, and sinking a thermal oxide into the epitaxial layer. A support is then mounted on the epitaxial layer top and the substrate removed, for example, by electrolytic etching. Circuit elements are built into the dielectrically isolated semiconductor regions. The technique allows the provision of connections on both sides of the regions containing circuit elements.

ELSE KOOI INVENTOR.

BY [signature]

AGENT

INVENTOR.
ELSE KOOI
BY
[signature]
AGENT

INVENTOR.

ELSE KOOI

BY

AGENT

INVENTOR.

ELSE KOOI

BY

AGENT

METHOD OF MANUFACTURING A SEMICONDUCTOR DEVICE AND DEVICE MANUFACTURED BY SAID METHOD

The invention relates to a method of manufacturing a semiconductor device comprising a semiconductor body having at least one semiconductor circuit element, in which a substantially flat, layerlike pattern of silica is applied, which is sunk over at least part of its thickness in a silicon surface layer of the body by means of an oxidation treatment, during which the silicon surface is locally protected from the oxidation, and to a semiconductor device manufactured by said method.

Semiconductor devices of the kind set forth are employed inter alia in integrated circuits of the so-called planar type, in which silicon regions comprising semiconductor circuit elements or parts of such silicon regions have to be electrically separated from each other. The silica may then serve both as an electrically insulating material between the silicon regions to be separated and for stabilizing PN junctions appearing at the surface at the interface between the silicon and the silica.

A method of the kind set forth is described in prior Belgion Pat. No. 704,674. In this case the method starts from a silicon layer applied to a support and during the application of the sunken silica pattern the oxidizing treatment is continued until the pattern extends throughout the thickness of the silicon layer, and the silicon layer is then divided into a plurality of portions which are separated from each other by the pattern. Then circuit elements may be provided in said layer, which elements may be interconnected by metal tracks.

Although this method permits of obtaining said semiconductor structures and/or circuits, certain other important structures can in practice be manufactured in this way only with great difficulty or not at all. This applies particularly to those structures or circuits in which on both sides of the layer, that is to say, also between the layer and the support, electrical connections, for example, formed by metal tracks, have to be established. Moreover, in practice it is very difficult to apply a monocrystalline silicon layer to an insulating support.

The invention has for its object to provide a method in which said disadvantages are obviated wholly or at least for a major part, while for example also structures having a layer applied to an insulating support and comprising an oxide pattern and monocrystalline silicon regions, which layer has to be provided on both sides with contacts, can be obtained in a simple manner.

A method of the kind set forth according to the invention is characterized in that the body is reduced to the surface layer in which and throughout the thickness of which the pattern is sunk by subjecting the body on the side opposite the patterned side to a material-removing treatment and in that the semiconductor circuit element is provided in this surface layer.

The method according to the invention has inter alia the advantage that after the oxidizing treatment the two sides of the surface layer may be subjected to treatments such as the diffusion of impurities and the application of conductors, which provides great freedom in the choice of the structures to be manufactured.

In a preferred embodiment first the pattern is provided and subsequently the material-removing treatment is carried out. The circuit elements to be provided may then be applied also wholly or partly prior to the removal of material. In other cases it may be preferred to apply the pattern after the removal of material.

In principle it is possible by carrying out the method according to the invention to obtain a self-supporting layer. However, since the desirability of reasonable oxidizing periods brings about the use of surface layers of a thickness preferably less than 5 $\mu$m., it will in general be preferred to arrange the body by the side of the pattern on a support, for example, an electrically insulating support prior to the removal of material.

In a further preferred, important method embodying the invention the surface layer forms part of an epitaxial layer applied to a substrate of semiconductor material, for example, monocrystalline silicon. In a simple manner a silicon layer can be applied to a substrate having a doping level differing from that of the layer, for example a higher doping level, which provides a possibility of carrying out given, effective material-removing treatments to be described more fully hereinafter.

The material may be removed in many ways, for example, by abrading, grinding, oxidizing and/or etching. It is particularly advantageous to remove the material at least partly by using an electrolytic etching method, which provides inter alia a particularly uniform removal of material, while the rate can be adjusted in a very simple manner by current and voltage control.

A very important method embodying the invention is characterized in that an electrolytic etching process is used, in which before the oxide pattern is reached the etching process automatically at a boundary layer in the body between regions of different doping levels. The method may start from a substrate of highly doped *p*-type silicon, having an *n*-type silicon layer of thickness slightly exceeding the thickness of said sunken oxide pattern. By electrolytic etching, for example, in a solution of hydrofluoride, the *p*-type conductive silicon, which is used as an anode, is removed and when the *n*-type conductive layer is reached, the etching rate approaches substantially zero. The remaining thin silicon region is then removed by chemical etching or by grinding until the oxide pattern is exposed. In this case also a substrate of very highly doped *n*-type silicon may be employed, which can be very readily etched electrolytically, whereas in the case of a *p*-type epitaxial layer for example, a *p*-type substrate may be employed, which is doped to such a higher extent than the layer applied thereto that, when the layer is reached, variation of the etching current occurs which is sufficient for the operator to stop the etching process in due time.

The electrical connection of circuit elements provided in the surface layer may be established by means of metal tracks applied to at least one side of the layer. Under certain conditions the connection may be established by means of highly doped, conductive, for example diffused surface zones or, particularly in the case of a connection for high-frequency currents or voltages, by capacitive agency. In an important preferred embodiment of the invention at least one metal track is applied to the surface layer prior to the application of the insulating support, which track establishes a contact to a circuit element.

A further preferred embodiment is characterized in that on both sides of the surface layer at least one metal track is provided, which establishes a contact to a circuit element.

An important advantage of the method according to the invention resides in the possibility of minimizing, in the case of complicated circuitry with crossing connections, the capacitances at the areas of the crossings and the risk of short circuits. A further preferred embodiment is characterized in that two metal tracks applied each on one side of the surface layer cross each other on either side of the oxide pattern. The capacitance appearing at the area of the crossing is then considerably smaller than in the case in which the two crossing connections are established on the same surface and are separated from each other only by a thin insulating layer. Also the risk of short-circuits between the two conductors at the crossing is thus practically avoided.

In a further preferred embodiment metal tracks located on either side of the surface layer are connected to a metal layer, said metal layers being located opposite each other and forming together with the intermediate part of the oxide pattern a circuit element in the form of a capacitor.

In a further important embodiment a group of substantially parallel metal tracks is provided on either side of the surface layer, which groups cross each other, while at least at one crossing an island-shaped silicon region comprising a circuit element is provided, which element is in contact with the two crossing metal tracks. Such structures are known under the term of crossbar systems and are employed inter alia as fixed memory matrices.

The metal tracks provided between the insulating support and the surface layer have in general to be connected to a current or voltage source or else to a measuring and/or control device. For this purpose the support may be extended beyond the surface layer so that the metal tracks between the support and the layer can be contacted outside the layer. However, in accordance with the invention it is often advantageous to etch an opening in the oxide pattern, in which case a connecting conductor is provided on the side remote from the support and connected through said opening to a metal track on the support side.

The support may consist of different materials, for example, ceramic material such as $Al_2O_3$, which is cemented to the surface layer. It is advantageous to provide a support of polyvinylacetate. In a further preferred embodiment a support is formed from polycrystalline silicon, which is deposited on the surface layer, for example, by the decomposition of volatile chemical compounds. In this manner a support is obtained, which has a thermal expansion coefficient matching the surface layer quite satisfactorily. Since the polycrystalline material has to be applied at a comparatively high temperature, this should be taken into account with the choice of the material for the metal tracks applied previously to the surface layer on the support side. For this purpose, for example, tungsten or other high-melting-point metals will be used.

The invention furthermore relates to a semiconductor device manufactured by the method according to the invention and to a semiconductor device comprising a semiconductor body having a silicon layer with island-shaped silicon regions and a silica pattern provided throughout the thickness of said layer, on either side of which layer a group of substantially parallel metal tracks is provided, said groups crossing each other, while at least at one crossing a circuit element is in contact with the two crossing metal tracks.

The invention will now be described more fully with reference to a few embodiments and the drawing in which FIG. 1 shows a plan view of a semiconductor device manufactured by a method according to the invention.

For the sake of clarity the FIGURES are not to scale, particularly with respect to the vertical dimensions.

Figure 1:
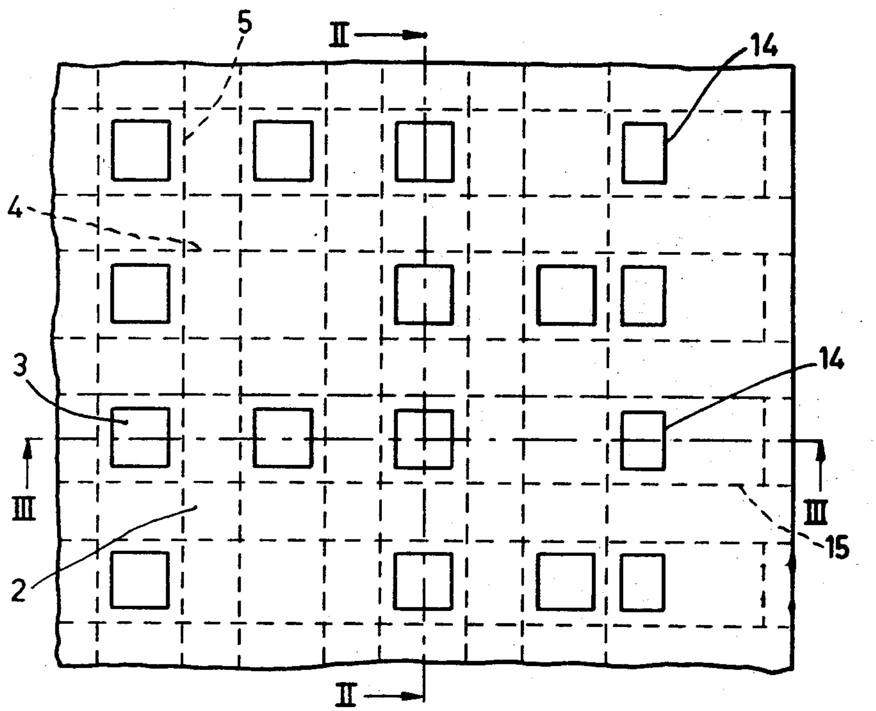
Figure 2:
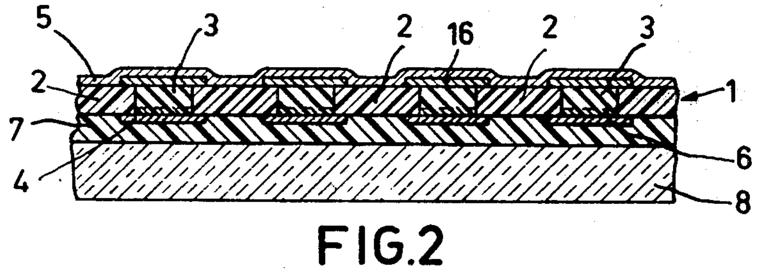
FIGS. 2 and 3 are diagrammatic cross-sectional views taken on the lines II—II and III—III respectively of the device of FIG. 1.
Figure 3:
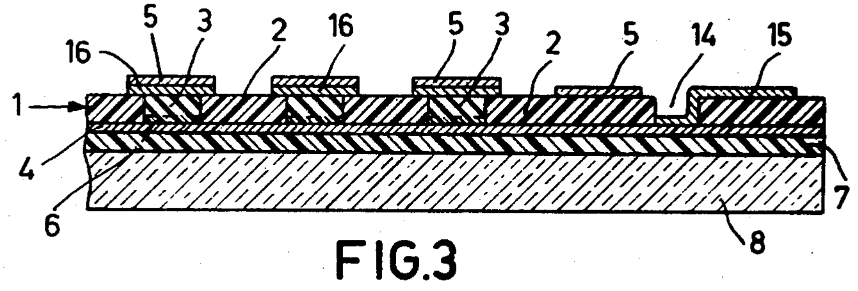
Figure 4:
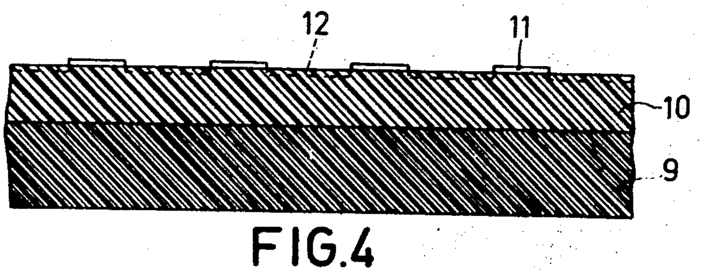
FIGS. 4 to 7 are schematic cross-sectional views taken on the lines II—II of the device of FIG. 1 in consecutive stages of manufacture.
Figure 5:
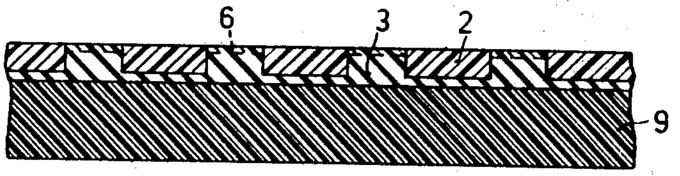
Figure 6:
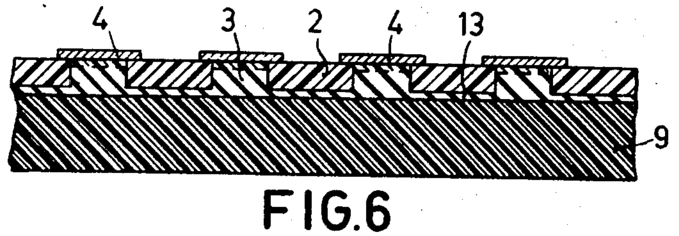
Figure 7:
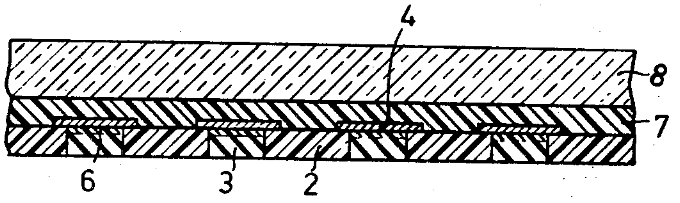

FIG. 1 is a plan view and FIGS. 2 and 3 are diagrammatic cross-sectional views of a semiconductor device manufactured by the method according to the invention. This semiconductor device comprises a semiconductor body having a silicon layer 1 (see FIGS. 1, 2, 3), in which and throughout the thickness of which a pattern 2 of silica is sunk. The layer 1 comprises island-shaped silicon regions 3 of *n*-type conductivity. On either side of the layer 1 a group of substantially parallel metal tracks (4, 5) is provided. These metal tracks are indicated in the plan view of FIG. 1 by broken lines. The groups 4 and 5 cross each other at given places on either side of the oxide pattern 2, whereas at a plurality of further crossings silicon islands 3 are found. These silicon islands have a diffused, highly doped *n*-type surface layer 6 (see FIGS. 2, 3). The metal tracks 4 consist of aluminum and form an ohmic contact with the surface layer 6.

On the opposite side gold layers 16 are applied to the silicon islands, while aluminum tracks 5 are deposited on said layers. The gold layers 16 together with the silicon islands 3 form a schottky barrier so that at a number of crossings diodes are formed, which are in contact with the two-crossing metal tracks.

The silicon layer 1 with the metal tracks applied thereto is located on a support 7 of polyvinylacetate, which in itself is applied to a glass plate 8.

Such a device may serve as a fixed memory circuit. With reference to FIGS. 4 to 7 it will now be described how this device according to the invention may be manufactured.

The basic material is a substrate 9 of single-crystal *n*-type arsenic-doped silicon having a resistivity of 0.01 Ohm cm. (see FIG. 4). By generally known techniques an epitaxial layer 10 is grown thereon to a thickness of 7 $\mu$m., the resistivity being 0.5 Ohm cm.

This epitaxial layer 10 is then provided in known manner with a layer 11 of silicon nitride by passing over silane and ammonia at a temperature of about 1000° C for such a long time that a nitride layer of 0.4 $\mu$m. is obtained. This nitride layer is then reduced to islands of dimensions of 20 × 20 $\mu$m. by photolithographic etching techniques and phosphoric acid as an etchant.

The part of the layer 10 not covered by nitride is then etched away to a depth of about 1.5 $\mu$m. (sunken parts 12 in FIG. 4) in order to compensate for the increase in volume involved in the subsequent oxidation.

Then the resultant structure is subjected to an oxidizing treatment by passing over stream at 1000° C. for 36 hours. Thus (see FIG. 5) the parts of the layer 10 not covered by nitride are provided with an oxide layer 2 of a thickness of 3 $\mu$m., whereas the silicon located beneath the nitride is protected from the oxidation. The sunken parts 12 are thus filled so that again a substantially flat surface is obtained after the nitride layer 11 is removed. Moreover, during this oxidation the interface between the substrate 9 and the epitaxial layer 10 is shifted in place by diffusion of doping impurity out of the substrate to the surface over a distance of about 1 to 2 $\mu$m.

After the nitride is etched away, the surface of the layer is subjected in known manner to phosphorus diffusion so that (see FIG. 5) a highly doped *n*-type surface layer 6 of a thickness of about 0.1 $\mu$m. is formed in the silicon regions 3.

Subsequently, by vapor deposition and by using known photolithographic etching techniques aluminum strips 4 (see FIG. 6) are provided, which establish an ohmic contact with the highly doped layers 6.

The layer is then provided with an electrically insulating support. To this end a glass plate 8 is heated at about 200° to 250° C., while polyvinylacetate power is deposited on the plate, which powder melts and forms a liquid layer 7, to which the semiconductor body is applied by the side of the pattern 2. By anodic etching in hydrofluoric acid of a concentration of about 5 percent by weight (the positive terminal may be connected, for example, to parts of the metal tracks 4 being exposed for this purpose) the highly doped substrate 9 is removed. The etching current is about 0.5 A/cm². When the boundary face between the substrate and the epitaxial layer is reached, the etching process practically ceases. See copending applications, U.S. Pat. Ser. No. 707,031, filed Feb. 21, 1968 and U.S. Pat. Ser. No. 708,306, filed Feb. 26, 1968 for additional details for doing this.

The remaining part 13 (see FIG. 6) of the epitaxial layer is then removed by chemical etching, for example, in HF-$HNO_3$ mixture or by grinding. The result is the structure of FIG. 7.

The surface thus exposed by said material-removing treatments is provided by vapor deposition with a gold layer 16, which is restricted by known etching and masking techniques substantially to the silicon islands. This gold layer forms a rectifying contact with the silicon. The aluminum tracks 5 are then applied also by vapor deposition and etching, which tracks are connected to the silicon through the intermediate gold layer 16.

For contacting the aluminum tracks 4 located between the support 7 and the surface layer (2, 3), openings 14 (see FIGS. 1, 3) are etched in the pattern 2 and aluminum connecting conductors 15 are provided on the side remote from the support, which conductors are in contact through the openings 14 with the aluminum tracks 4.

Instead of using a support of polyvinylacetate it may sometimes be advantageous to use a support of polycrystalline silicon. Instead of aluminum, for example, tungsten will then be used in view of the higher temperature resistance.

In this example first the oxide pattern 2 is applied and then the material-removing process is carried out. As an alternative, first the material-removing process may be carried out, the oxide pattern being subsequently applied by local oxidation of the resultant layer throughout the thickness thereof. In this case a support resistant to the oxidizing temperature, for example, of polycrystalline silicon will be used, while also the conductive tracks between the support and the layer have to be made of temperature- and oxidation-resistant materials.

Figure 8:
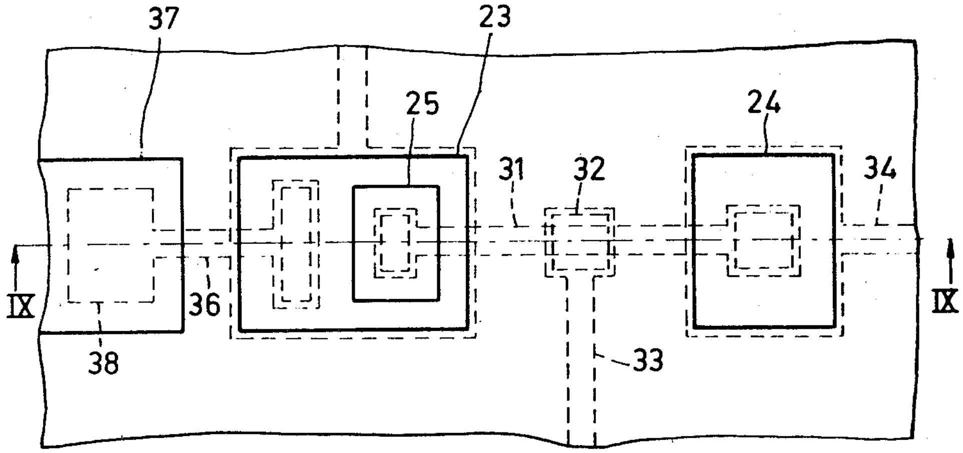
FIG. 8 is a plan view of a further semiconductor device manufactured by the method according to the invention.
Figures 9, 10, 11:
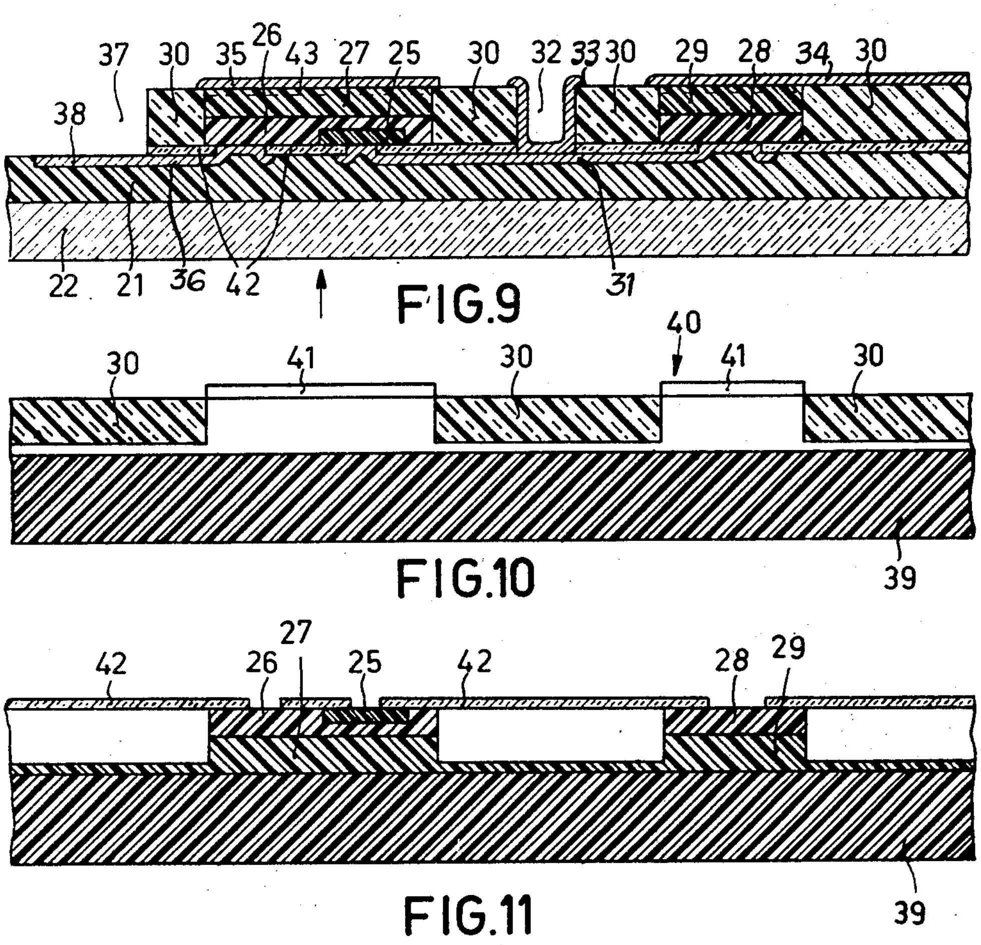
FIG. 9 is a schematic cross-sectional view taken on the line IX—IX of the device of FIG. 8.
FIGS. 10 to 13 are diagrammatic sectional views taken on the line IX—IX of the device of FIG. 8 in consecutive stages of manufacture.
Figure 12:
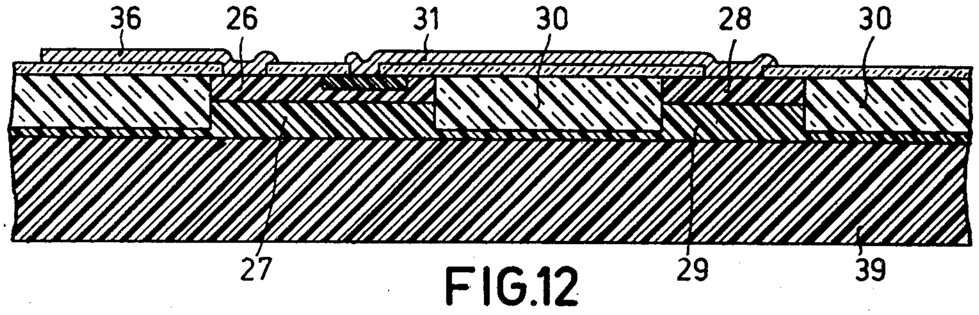

FIG. 8 is an elevation in the direction of the arrow of FIG. 9 and FIG. 9 is a cross-sectional view taken on the line IX—IX of FIG. 8 of a part of an integrated circuit manufactured by a method according to the invention. A support 21 of polyvinylacetate (see FIGS. 8 and 9) applied to a glass plate 22 is provided with a layer formed by silicon regions 23 and 24, in which a transistor and a diode respectively are arranged. The transistor comprises an *n*-type emitter region 25, a *p*-type base region 26 and an *n*-type collector region 27. The diode comprises a *p*-type region 28 and an *n*-type region 29. The silicon regions 23 and 24 are surrounded by an oxide pattern 30, which extends throughout the thickness of the layer. The emitter 25 is connected through an aluminum track 31 located between the support and the oxide to the *p*-type region 28 of the diode. The aluminum track 31 is connected through an opening 32 etched in the silica to a connecting conductor 33, applied to the other side of the layer. Contact windows and metal layers are indicated in FIG. 8 by broken lines. The *n*-type region 29 of the diode is connected to an aluminum track 34 and the collector region 27 of the transistor is connected to an aluminum track 35, whereas the base region 26 is connected to an aluminum track 36, located in a recess 37 of the layer on the support 21, where it is connected to the contact layer 38.

The manufacture of such an integrated circuit is illustrated in cross sectional views in a concise survey in FIGS. 10 – 13. As in the preceding example, a *p*-type silicon substrate 39 of a resistivity of 0.02 Ohm cm. is provided with an epitaxial layer 40, which is masked at the areas of the silicon regions 23 and 24 to be formed by silicon nitride 41. By oxidation the pattern 30 (see FIG. 10) is then formed. After the removal of the nitride a *p*-type conductive layer is diffused to form the base region 26 and the diode region 28. An oxide layer 42 is then pyrolytically applied throughout the surface, for example, by the decomposition of oxysilanes. In the layer 42 a window is etched for diffusing the emitter region 25 and then windows are etched for contacting the various zones (see FIG. 11). By vapor deposition and etching (see FIG. 12) the aluminum tracks 31 and 36 are then provided, after which the assembly (see FIG. 13) is applied in a similar manner as described with reference to the preceding example through a layer 21 of polyvinylacetate to a glass plate 22.

Figure 13:
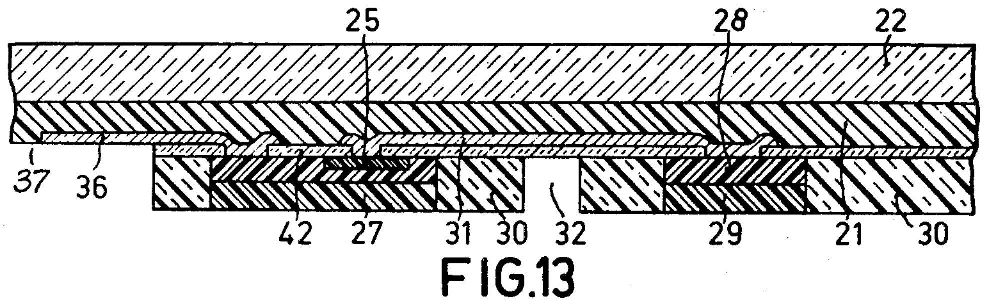

In this manner as described in the preceding example the substrate 39 is then etched off electrolytically, after which the remaining part of the layer is removed by grinding or etching until the oxide pattern 30 is reached. After etching of the contact opening 32 and the recess 37 the structure of FIG. 13 is obtained. Finally the aluminum tracks 33, 34 and 35 are applied so that the final structure of FIGS. 8 and 9 is formed. In order to establish a satisfactory ohmic contact between the aluminum and the *n*-type zones 27 and 29 highly doped *n*-type surface layers 43 are formed, by ion implantation.

Obviously more than one circuit element and, under given conditions, a complete circuitry comprising a plurality of transistors, diodes, resistors, etc. may be provided in a silicon region. By using the method according to the invention a plurality of integrated circuits separated from each other by electrically insulating regions may be assembled.

Figure 14:
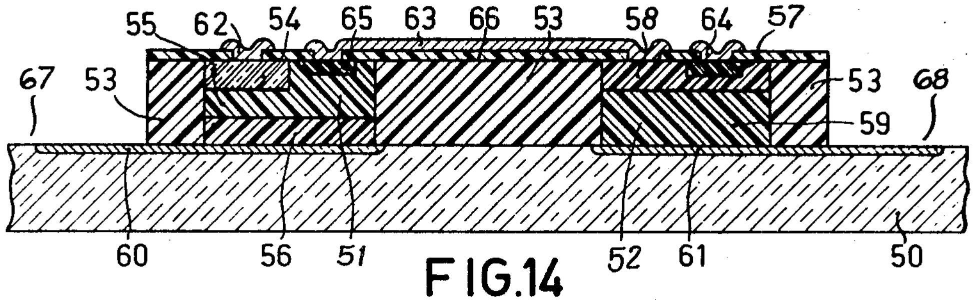
FIG. 14 is a diagrammatic cross-sectional view of a third device manufactured by the method according to the invention.

FIG. 14 illustrates how the method according to the invention can provide in a simple manner in the same stratified structure NPN- and PNP-transistors by diffusing surface zones into both sides of the layer. A support 50 of polycrystalline silicon is provided with a layer formed by silicon regions having transistors 51 and 52 and a silica pattern 53, sunk throughout the thickness of the layer. The transistor 51 comprises a *p*-type emitter zone 54, an *n*-type base zone 55 and a *p*-type collector zone 56. The transistor 52 comprises an *n*-type emitter zone 57, a *p*-type base zone 58 and an *n*-type collector zone 59. The two collector zones 56 and 59 are contacted by tungsten tracks exposed on the support 50 beyond the layer (51, 52, 53), which tracks may be provided with conductors. The emitter conductors 62 and 64 and the conductor 63 interconnecting the two base zones are formed by aluminum tracks. In order to establish a satisfactory ohmic contact on the base zone 55 a highly doped *n*-type zone 65 is diffused.

This integrated structure may be manufactured in the same manner as referred to in the preceding examples. First an epitaxial, *n*-type conductive layer having the same dope as the regions 55 and 59 is provided with the oxide pattern 53. Then the *p*-type zone 56 is selectively diffused into one of the silicon regions in a conventional manner, after which by means of the tungsten tracks 60 and 61, is known manner by sputtering and masking, ohmic contacts are established with the zones 56 and 59. Then a layer 50 of polycrystalline silicon is applied to this side of the layer by employing generally known techniques, for example by the decomposition of silicon tetrachloride. After the layer (51, 52, 53) is restricted by etching and/or grinding on the side opposite the pattern 53 to the surface layer in which and throughout the thickness of which the pattern 53 is applied, an oxide layer is applied again by pyrolytic agency to the side of the layer opposite the support 50. Through windows etched in this oxide layer successively the *p*-type zones 54 and 58 and the *n*-type zones 57 and 65 are diffused. In the oxide layer 66 on the surface subsequent to said diffusions are then etched in a conventional manner contact openings and the aluminum tracks 62, 63, and 64 are applied by known vapor deposition and etching techniques. In order to expose the tungsten conductors 60 and 61 parts 67 of the oxide pattern 53 are finally removed by conventional masking and etching methods.

The structure of FIG. 14 can be obtained since on both sides of the layer (51, 52, 53) diffusions can be carried out and contacts can be established, which is enabled by the method according to the invention.

Figure 15:
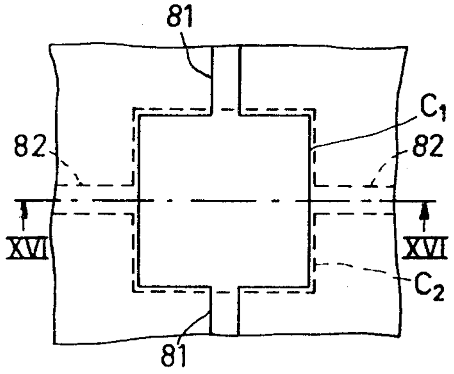
FIG. 15 is a plan view of a detail of a further semiconductor device manufactured by the method according to the invention and FIG. 16 is a cross-sectional view taken on the line XVI—XVI in FIG. 15.
Figure 16:
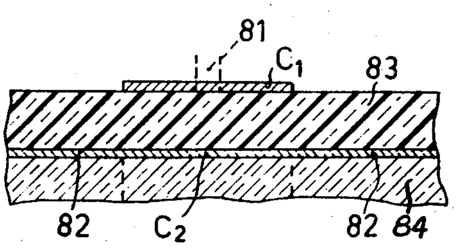

Not only in the silicon regions but, if desired, some circuit elements may also be arranged in or on the oxide pattern. FIG. 15 is a plan view and FIG. 16 is a cross-sectional view taken on the line XVI—XVI of part of the semiconductor device according to the invention, in which a layer having an oxide pattern 83, applied to an insulating support 84, is provided on either side of the oxide pattern 83 with metal tracks 81 and 82, which are connected to metal layers $C_1$ and $C_2$, which form a capacitor with the intermediate portion of the pattern 83.

It will be obvious that the invention is not restricted to the embodiments described above and that within the scope of the invention many variants are possible to those skilled in the art. For example, the basic epitaxial silicon layer may be applied to a substrate not consisting of silicon, for example a substrate of a III–V compound. Apart from said oxide pattern other materials differing from silicon may be present in the surface layer. Within the same uninterrupted silicon region a plurality of circuit elements may be provided, which may, in addition, be integrated with each other. For carrying out the selective diffusions other masking layers than said pyrolytic layers, for example nitride layers may be employed. Moreover, other circuit elements than those mentioned above may be provided, for example, resistors, field-effect transistors, light-sensitive elements such as photoresistors, solar cells, phototransistors, optoelectronic elements or detectors for electromagnetic and/or corpuscular radiation, and so on. Finally, it may be advantageous under given conditions to use other substrate materials than those mentioned, for example, the electrically insulating support may be replaced by a metal support, for example, of molybdenum, which may provide satisfactory cooling and low series resistances, if the use of the circuitry allows for the use of a metal support.

What is claimed is:

1. A method of manufacturing a semiconductor device comprising a thin layer containing a pattern of silicon regions and a pattern of silica extending throughout the thickness of the layer, said method comprising growing on the surface of a thick single-crystal silicon body a thin epitaxial layer with a conductivity different from that of the body, locally masking against oxidation the surface of the epitaxial layer by applying on selected areas thereat a thin layer of a material completely protecting the silicon against oxidation, thereafter subjecting surface portions on the top surface of the epitaxial layer to a thermal oxidizing treatment to sink into the top surface a substantially flat planar pattern of silicon oxide only over part of the combined layer-body thickness to form a thin top surface layer of silicon containing the sunken oxide pattern, thereafter providing an insulating support for the combined layer-body connected to its top surface and thus at the silicon surface layer containing the sunken oxide pattern, thereafter subjecting the thus supported silicon body on the side opposite the sunken oxide pattern to a material removing treatment until the silicon body is reduced substantially to the thickness of the said epitaxial layer with the sunken oxide pattern extending throughout the thickness of said epitaxial layer forming silicon regions bounded by the silica pattern, and forming semiconductor circuit elements in silicon regions of said epitaxial layer, said last-named step including introducing an impurity to form PN junctions such that no junctions terminate at more than one single major surface of the epitaxial layer.

2. A method as set forth in claim 1 wherein the final body thickness is not more than 5 μm. and the masking layer comprises silicon nitride.

3. A method as set forth in claim 1 wherein the insulating support comprises polycrystalline silicon or polyvinylacetate.

4. A method as set forth in claim 1 wherein the substrate is removed by a treatment comprising electrolytical etching.

5. A method as set forth in claim 1 wherein prior to mounting of the body on a support, at least one metal track is provided on the surface of the body containing the silica pattern so as to connect to a circuit element in a silicon regions.

6. A method as set forth in claim 5 wherein subsequent to the material removing step, an opening is made in the silica pattern, a conductor is provided on the side of the body from which material was removed, and the conductor is connected to the metal track through the silica pattern opening.

7. A method as set forth in claim 1 wherein at least one metal track is provided on opposite sides of the final thickness of the silicon body so as to contact circuit elements in the silicon regions and extend over the silica pattern.

8. A method as set forth in claim 7 wherein metal layers are provided on opposite sides of a silicon region to form a capacitor, and the metal tracks are connected to the metal layers.

9. A method as set forth in claim 7 wherein two groups of crossing metal tracks are provided, one on each side of the final body, the crossings being located at the silicon regions.

PO-1050
(5/69)

UNITED STATES PATENT OFFICE
CERTIFICATE OF CORRECTION

Patent No. 3602982 Dated September 7, 1971

Inventor(s) Else Kooi

It is certified that error appears in the above-identified patent and that said Letters Patent are hereby corrected as shown below:

Column 8, line 18, "regions" should read -- region --;

line 29, "silicon" should read -- silica --.

Signed and sealed this 18th day of January 1972.

(SEAL)
Attest:

EDWARD M.FLETCHER,JR.
Attesting Officer

ROBERT GOTTSCHALK
Acting Commissioner of Patents